(12) United States Patent
Kwon et al.

(10) Patent No.: US 8,354,708 B2
(45) Date of Patent: Jan. 15, 2013

(54) METHODS OF FORMING AND OPERATING SEMICONDUCTOR DEVICE

(75) Inventors: Wook-Hyun Kwon, Yongin-si (KR);
Byung-Gook Park, Seoul (KR);
Yun-Heub Song, Seongnam-si (KR);
Yoon Kim, Seoul (KR)

(73) Assignees: Samsung Electronics Co., Ltd., Suwon-si, Gyeonggi-do (KR); Seoul National University Industry Foundation, Seoul (KR)

( * ) Notice: Subject to any disclaimer, the term of this patent is extended or adjusted under 35 U.S.C. 154(b) by 95 days.

(21) Appl. No.: 13/087,643

(22) Filed: Apr. 15, 2011

(65) Prior Publication Data

US 2011/0194356 A1 Aug. 11, 2011

Related U.S. Application Data

(62) Division of application No. 12/458,218, filed on Jul. 6, 2009, now Pat. No. 7,928,501.

(30) Foreign Application Priority Data

Jul. 4, 2008 (KR) .......................... 10-2008-0065120

(51) Int. Cl.
*H01L 29/792* (2006.01)
(52) U.S. Cl. .................... 257/324; 257/314; 257/E29.17

(58) Field of Classification Search .................. 257/324, 257/321, E29.17, E29.309
See application file for complete search history.

(56) References Cited

U.S. PATENT DOCUMENTS

| 6,878,991 | B1 | 4/2005 | Forbes |
| 7,199,426 | B2 | 4/2007 | Ogura et al. |
| 7,282,762 | B2 | 10/2007 | Forbes |
| 7,439,574 | B2 | 10/2008 | Kim et al. |
| 7,525,146 | B2 | 4/2009 | Song et al. |
| 2004/0031984 | A1 | 2/2004 | Kianian et al. |
| 2009/0004786 | A1 | 1/2009 | Radigan et al. |

FOREIGN PATENT DOCUMENTS

| KR | 10-2004-0043044 A | 5/2004 |
| KR | 10-2006-0043740 A | 5/2006 |
| KR | 10-0697291 B1 | 3/2007 |

*Primary Examiner* — Mamadou Diallo
(74) *Attorney, Agent, or Firm* — Lee & Morse, P.C.

(57) ABSTRACT

Provided are a semiconductor device and a methods of forming and operating the semiconductor device. The semiconductor device may include active pillars extending from a semiconductor substrate and disposed two dimensionally disposed on the semiconductor substrate, upper interconnections connecting the active pillars along one direction, lower interconnections crossing the upper interconnections and disposed between the active pillars, word lines crossing the upper interconnections and disposed between the active pillars, and data storage patterns disposed between the word lines and the active pillars.

12 Claims, 14 Drawing Sheets

METHODS OF FORMING AND OPERATING SEMICONDUCTOR DEVICE

CROSS REFERENCE TO RELATED APPLICATION

This is a divisional application based on application Ser. No. 12/458,218, filed Jul. 6, 2009, now U.S. Pat. No. 7928501 the entire contents of which is hereby incorporated by reference.

BACKGROUND

1. Field

Embodiments relate to a semiconductor device and methods of forming and operating the semiconductor device.

2. Description of the Related Art

In semiconductor devices, increased integration is an important factor in realizing a high performance, low cost devices. Currently, in a two-dimensional memory semiconductor device or in a planar memory semiconductor device, integration is largely affected by a technique of forming a fine pattern, since integration is mainly determined by an area that a unit memory cell occupies. However, since equipment that is required to form a fine pattern is very expensive, economically increasing integration of a two-dimensional memory semiconductor device is limited.

SUMMARY

Embodiments are therefore directed to a semiconductor device and methods of forming and operating the same, which substantially overcome one or more of the problems due to the limitations and disadvantages of the related art.

It is therefore a feature of an embodiment to provide a semiconductor that can achieve a high integration by forming a fine pattern.

It is therefore another feature of an embodiment to provide a method of forming the semiconductor that has a fine pattern without using expensive equipment.

It is therefore another feature of an embodiment to provide a semiconductor device that may reduce a diffusion of electrons through band to band tunneling or trap to trap tunneling and a deformation of a charge storage distribution.

At least one of the above and other features and advantages may be realized by providing a semiconductor device including active pillars extending from a semiconductor substrate and disposed two dimensionally on the semiconductor substrate, upper interconnections connecting the active pillars along one direction, lower interconnections crossing the upper interconnections and disposed between the active pillar, word lines crossing the upper interconnections and disposed between the active pillars, and data storage patterns disposed between the word lines and the active pillars.

The lower interconnections may be impurity regions on the semiconductor substrate.

The lower interconnections may have a line shape crossing a plurality of upper interconnections.

Two word lines may be disposed between adjacent active pillars.

A distance between a lower surface of the word line and an upper surface of the word line may be at least 100 nm.

A width of the active pillar, measured along a major axis of the upper interconnection, may be at least 30 nm.

Two different data storage patterns may be on both sides of the active pillars and each of data storage patterns may have a plurality of data storage regions.

The data storage pattern may include a tunnel insulating layer adjacent to the active pillar, a blocking insulating layer adjacent to the word line, and a charge storage layer between the tunnel insulating layer and the blocking insulating layer.

A method of operating the semiconductor device that may have the data storage pattern disposed between one upper interconnection and one lower interconnection including at least a first data storage region and a second data storage region that are adjacent, but separated from each other, method may include programming the data storage region by selectively injecting charges into one of the first and second data storage regions.

The programming may include selectively pinching off a channel formed on a sidewall of the active pillar around one of regions adjacent to the upper and lower interconnections.

The programming may include injecting charges into the first data storage region using the upper interconnection and the lower interconnection as a source electrode and a drain electrode, respectively, and injecting charges into the second data storage region using the upper interconnection and the lower interconnection as a drain electrode and a source electrode, respectively.

The programming may include applying a voltage lower than a threshold voltage to nonselected word lines to prevent channels from being formed inside the active pillars adjacent to the nonselected word lines.

The programming may include applying a voltage applied to a selected lower interconnection to nonselected upper interconnections to prevent a difference of an electric potential from being generated between the nonselected upper interconnection and the selected lower interconnection.

The operation method may further include erasing discharging charges from the data storage patterns, wherein erasing includes discharging charges to the active pillar from the data storage pattern using a difference of an electric potential between the word line and the active pillar adjacent to the word line.

At least one of the above and other features and advantages may also be realized by providing a method of manufacturing a semiconductor device, the method including patterning a pad insulating layer and a mask layer on a substrate to form trenches defining active lines, forming a data storage pattern on active lines, forming a conductive layer spacers on the data storage pattern and patterning the conductive layer spacers to expose a side wall of the active lines, wherein the conductive layer spacers are physically separated and disposed on both sidewalls of the active lines, forming lower interconnections on a bottom of the trenches, forming a interlayer insulating layer on the lower interconnections, forming an upper impurity region on an exposed top surface of the active lines using the interlayer insulating layer as an ion mask, forming upper interconnections crossing the active lines, patterning the active line to form active pillars that is used as a channel region of a memory cell transistor, forming a pad electrically connected to the lower interconnections, and forming an interconnection structure connecting the upper interconnection and the pad to an upper line decoder and to a lower line decoder.

Forming the upper interconnections may further includes forming a conductive layer on the upper impurity regions, forming a mask pattern crossing the active lines, and patterning the conductive layer using the mask pattern as an etching mask, wherein the conductive layer is etched until a top surface of the active line is exposed.

The method of forming a semiconductor device may further includes patterning the upper impurity regions so that the upper impurity regions are locally formed under the upper interconnection.

Lower interconnection plugs may be connected to second interconnections to provide an electrical connection between the lower interconnections and the lower line decoder.

The method of forming a semiconductor device may further include forming an insulating spacer on sidewalls of first metal interconnections before forming the lower interconnection plugs.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
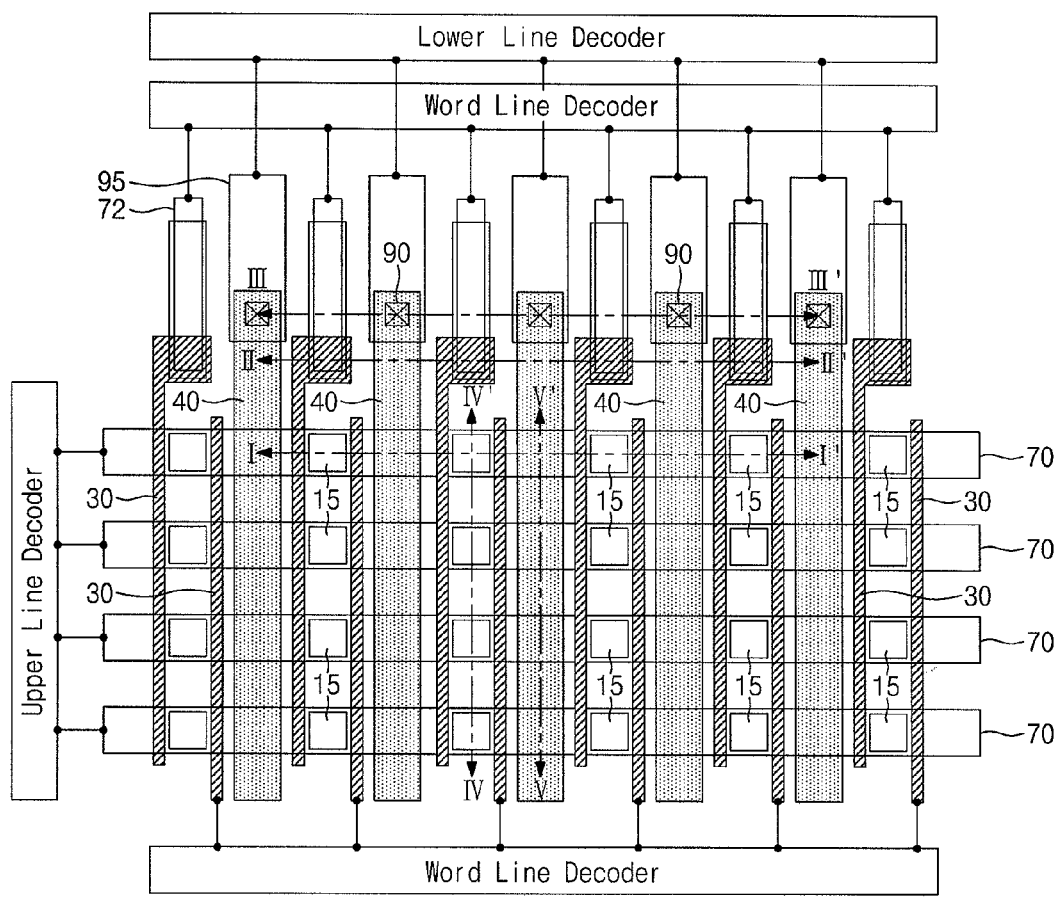
FIG. 1 illustrates a top plan view of a semiconductor device according to exemplary embodiments.

Korean Patent Application No. 10-2008-0065120, filed on Jul. 4, 2008, in the Korean Intellectual Property Office, and entitled: "Semiconductor Device and Methods of Operating the Same," is incorporated by reference herein in its entirety.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments may be described with reference to cross-sectional illustrations, which are schematic illustrations of idealized embodiments. As such, variations from the shapes of the illustrations, as a result, e.g., of manufacturing techniques and/or tolerances, are to be expected. Thus, embodiments should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present embodiments.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

Spatially relatively terms, such as "beneath," "below," "above," "upper," "top," "bottom" and the like, may be used to describe an element and/or feature's relationship to another element(s) and/or feature(s) as, e.g., illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

Figure 2:
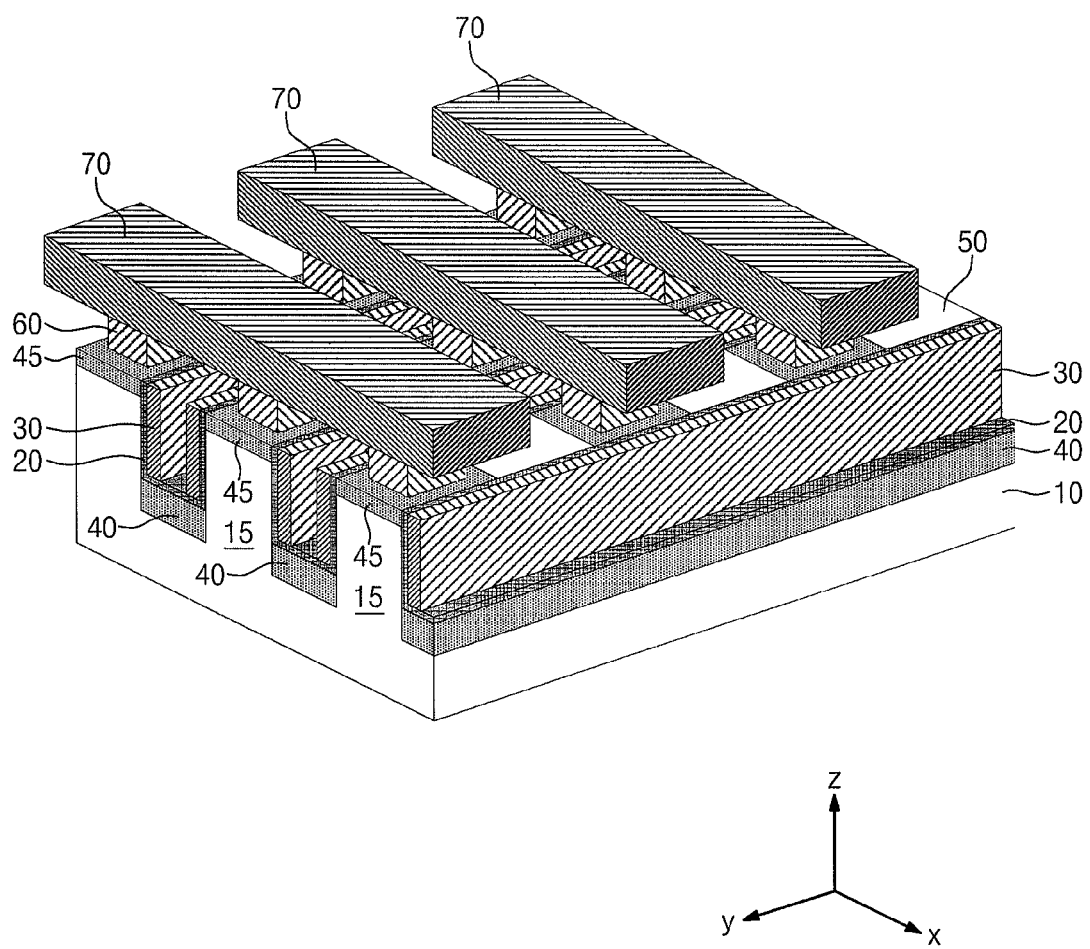
FIG. 2 illustrates a perspective view of a semiconductor device according to exemplary embodiments.
Figure 3:
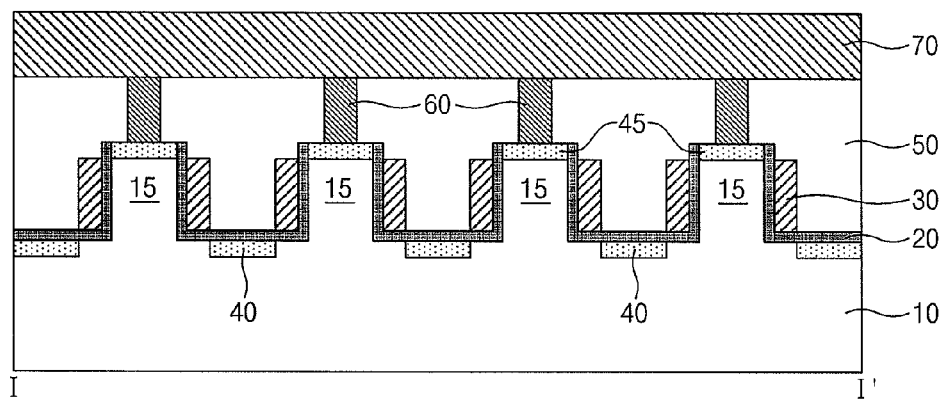
FIGS. 3 through 7 illustrate cross sectional views of a semiconductor device taken along the lines I-I', IV-IV', and V-V', respectively, of FIG. 1 according to exemplary embodiments.

FIGS. 1 and 2 respectively illustrate a top plan view and a perspective view of a semiconductor device according to some embodiments. FIGS. 3 through 7 illustrate cross sectional views of a semiconductor device taken along the lines I-I', II-II', IV-IV', and V-V', respectively, according to embodiments.

Referring to FIGS. 1 through 7, a plurality of active pillars 15 may be two dimensionally disposed on a semiconductor substrate 10. The active pillars 15 may be formed of semiconductor material, e.g., the same material as the semiconductor substrate 10, e.g., single crystalline silicon. In addition, the active pillars 15 and a crystal structure of the semiconductor substrate 10 may be continuous. For example, the active pillars 15 may be further protrusions of the crystal structure of the semiconductor substrate 10. The active pillars 15 may include upper impurity regions 45 disposed on upper regions of the active pillars 15. The upper impurity regions 45 may be used as a source electrode or a drain electrode of a memory cell transistor according to the present embodiment.

Upper interconnections 70 connecting the upper impurity regions 45 along one direction, e.g., x-axis, may be disposed above the active pillars 15. A lower interlayer insulating layer 50 may be disposed between the upper interconnections 70 and the active pillars 15. Further, the lower interlayer insulating layer 50 may be disposed between adjacent upper impurity regions 45 to fill the area between the active pillars 15. The upper interconnections 70 may include at least one metal material and may be connected to an upper line decoder through predetermined interconnection structures. The upper interconnections 70 may be in contact with the upper impurity regions 45 through first plugs 60. Each first plug 60 may correspond to an upper impurity region 45.

Figure 4:
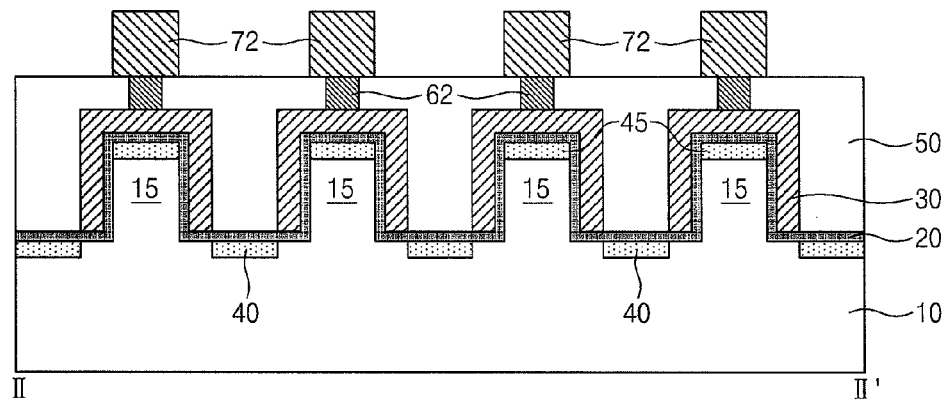

Word lines 30 crossing, e.g., extending along a y-axis that is perpendicular to the x-axis, the upper interconnections 70 may be disposed between the active pillars 15. The word lines 30 may be connected to a word line decoder through the interconnection structures. According to exemplary embodiments, a pair of the word lines 30 may be disposed between two adjacent active pillars 15 disposed perpendicularly, e.g., along the z-axis, to the upper interconnections 70. Each pair of the word lines 30 may be disposed to face a side wall of the different active pillar 15 and may be formed on top of the upper impurity regions 45 to be connected to the word line decoder through word line plugs 62 and a first metal interconnection 72 as illustrated in FIGS. 1 and 4. According to exemplary embodiments, the word line 30 of an odd number and the word line 30 of an even number may face each other and may be connected to two separate word line decoders, respectively. The word line plugs 62 and the first metal interconnections 72 may constitute the interconnection structures.

Lower interconnections 40 may be disposed under the word lines 30 and along the y-axis. According to exemplary embodiments, the lower interconnections 40 may be formed to have a line shape crossing a plurality of the upper interconnections 70 between the active pillars 15 (illustrated in FIG. 1). As illustrated in FIGS. 2 through 6, the lower interconnections 40 may also be formed to be a type of an impurity region in the semiconductor substrate 10 and, as most clearly seen in FIG. 5, may be connected to a lower line decoder through lower interconnection plugs 90 and second metal interconnections 95 constituting the interconnection structures. The second metal interconnections 95 may be between two adjacent active pillars 15 and may be above the first metal interconnections 72. An upper interlayer insulating layer 80 may insulate the second metal interconnections 95 from the first metal interconnections 72, the lower interconnection plugs 90 extending through the upper insulating layer 80 and the lower interlayer insulating layer 50.

Data storage patterns 20 may be disposed between the word lines 30 and the active pillars 15. According to exemplary embodiments, the data storage patterns 20 may be formed to cross, e.g., along the y-axis, the upper interconnections 70. The data storage patterns 20 may not cover top and bottom surfaces of the active pillars 15, e.g., a surface in contact with the upper impurity region 45 and a bottom surface in contact with the substrate 10, parallel to a major axis, e.g., x-axis in FIG. 2, of the upper interconnections 70, as may be clearly seen in FIG. 3. Thus, two data storage patterns 20 adjacent to, e.g., on each side of, the one active pillar 15 may be physically separated. The physical separation may reduce a diffusion of electrons through band to band tunneling or trap to trap tunneling and a deformation of a charge storage distribution due to the diffusion of electrons. According to exemplary embodiments, when viewed from a direction of a major axis, e.g., x-axis, of the upper interconnections 70, a width of the active pillar 150 may be at least 30 nm and a thickness of the word line 30, i.e., a distance between a top surface and a bottom surface, may be at least 100 nm to reduce a deformation of the charge storage distribution.

Figure 8:
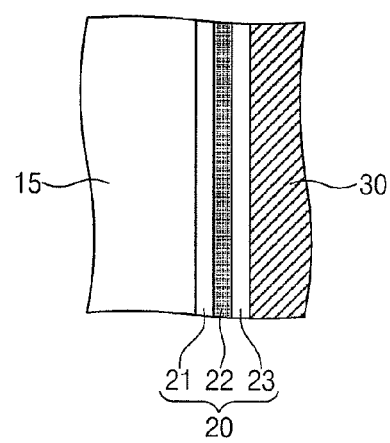
FIG. 8 illustrates a cross sectional view of data storage pattern of a semiconductor device according to exemplary embodiments.

Referring to FIG. 8, the data storage pattern 20 may include a tunnel insulating layer 21 covering a side wall of the active pillar 15, a blocking insulating layer 23 adjacent to the word line 30 and a charge storage layer 22 interposed between the tunnel insulating layer 21 and the blocking insulating layer 23. The tunnel insulating layer 21 may be a silicon oxynitride layer or a silicon nitride layer having charge trap sites. The tunnel insulating layer 21 is used as a thin layer to store data. The tunnel insulating layer 21 may be a thermal oxide layer or a chemical vapor deposition silicon oxide layer. The blocking insulating layer 23 may include at least one of materials having a dielectric constant higher than the tunnel insulating layer 21. The blocking insulating layer 23, the charge storage layer 22, and the tunnel insulating layer 21 may be formed using techniques disclosed in any published documents in the art or modifying the techniques disclosed in any published documents in the art.

FIGS. 9 through 14 illustrate perspective views of stages in a method of manufacturing a semiconductor device according to exemplary embodiments.

Figure 9:
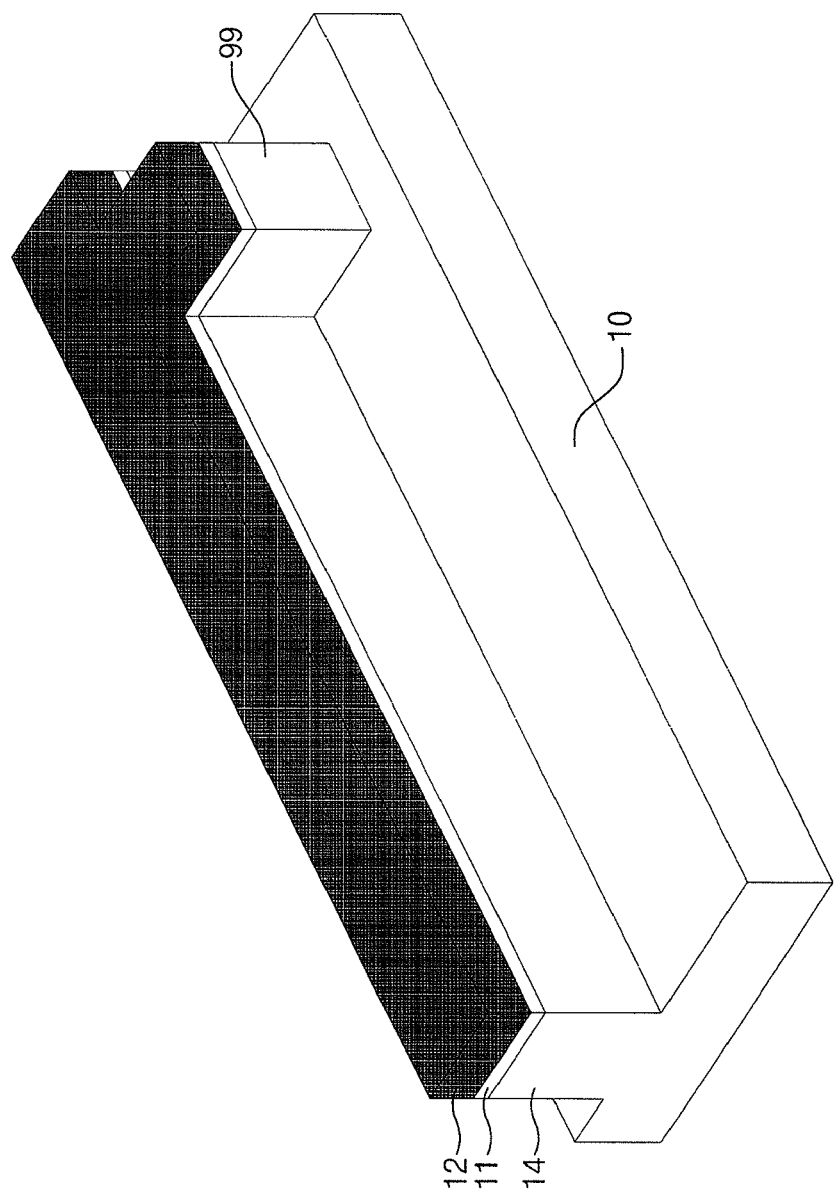
FIGS. 9 through 14 illustrate perspective views of stages in a method of manufacturing a semiconductor device according to exemplary embodiments.
Figure 10:
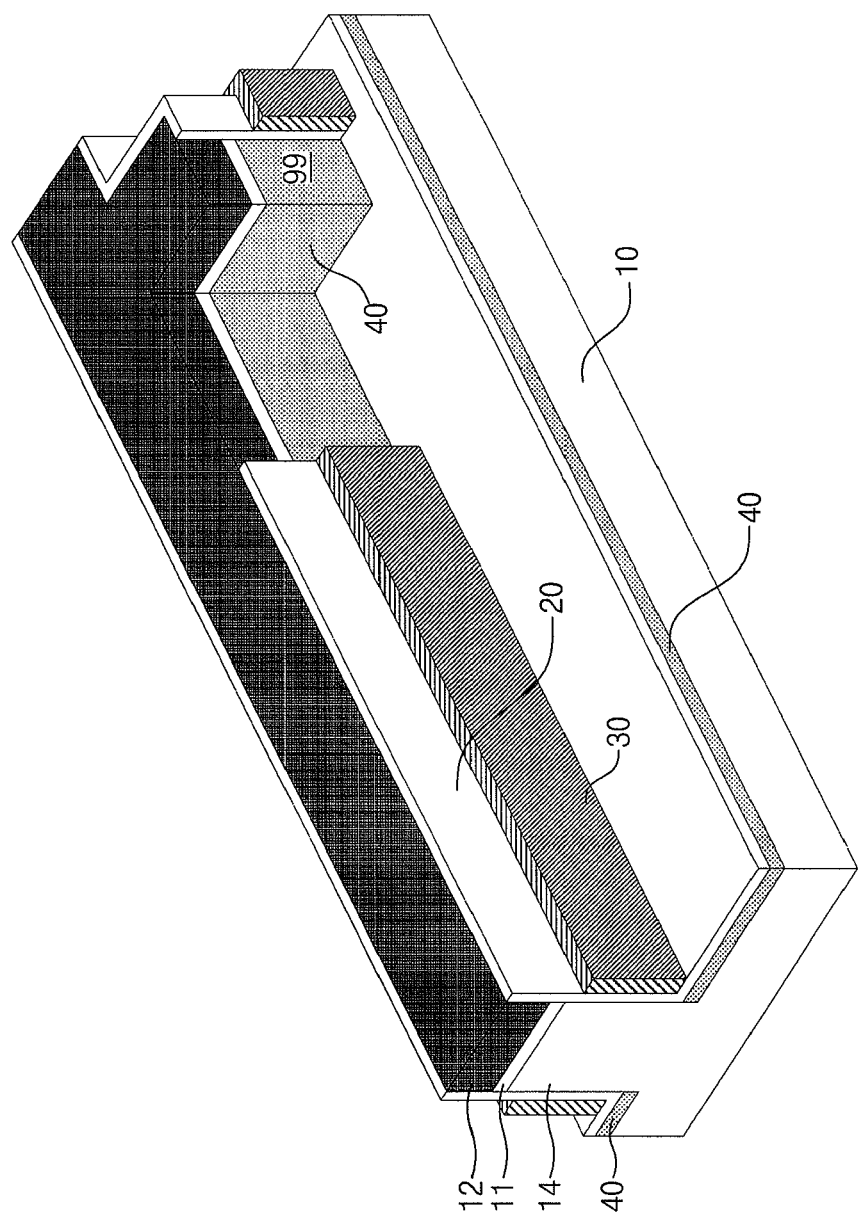

Referring to FIGS. 9 and 10, a pad insulating layer 11 and a mask layer 12 may be sequentially formed on the semiconductor substrate 10. The pad insulating layer 11 and the mask layer 12 may be sequentially patterned to form trenches defining active lines 14. According to this embodiment, the active line 14 may include a contact region 99 protruding from a side wall of the active line 14 to be electrically connected to the lower interconnection 40. The mask layer 12 may be formed of material which can be selectively removed while minimizing an etching of the lower interlayer insulating layer 50 (illustrated in FIG. 11) which will be formed in a subsequent process. The mask layer 12 may be a silicon nitride layer or a silicon oxide layer. When the mask layer 12 is a silicon nitride layer or a silicon oxide layer, the pad insulating layer 11 may be a silicon oxide layer.

The data storage pattern 20 may be formed on the resultant structure including the active lines 14. The data storage pattern 20 may have a thin layer structure. After conductive layer spacers disposed on side surfaces of the active lines 14 may be formed on the data storage pattern 20, the conductive layer spacers may be patterned to expose a side wall of the active line 14 near the contact region 99. As a result, the conductive layer spacers may be physically separated into two separate conductive layer spacers 30 which can be independently controlled and may be disposed on both sidewalls of the active line 14. The separated conductive layer spacers 30 may be used as the word lines, and thus, the two separate conductive layer spacers 30 will be referred to as word lines 30 hereinafter.

After forming the word lines 30, an ion implantation may be performed using the mask layer 12 as an ion mask to form lower interconnections 40 on a bottom of the trenches. The lower interconnections 40 may be formed to have a line shape on both sides of the active line 14 and may be used as the lower interconnections in a memory cell array according to the present embodiment. At this time, the data storage pattern 20 and the word lines 30 may also be used as the ion mask.

The ion implantation process may include a step of implanting impurities at an angle inclined toward a top surface of the semiconductor substrate 10. As a result, the lower interconnections 40 may be formed not only on a bottom of the trench but also on an exposed sidewall of the active line 14.

Figure 11:
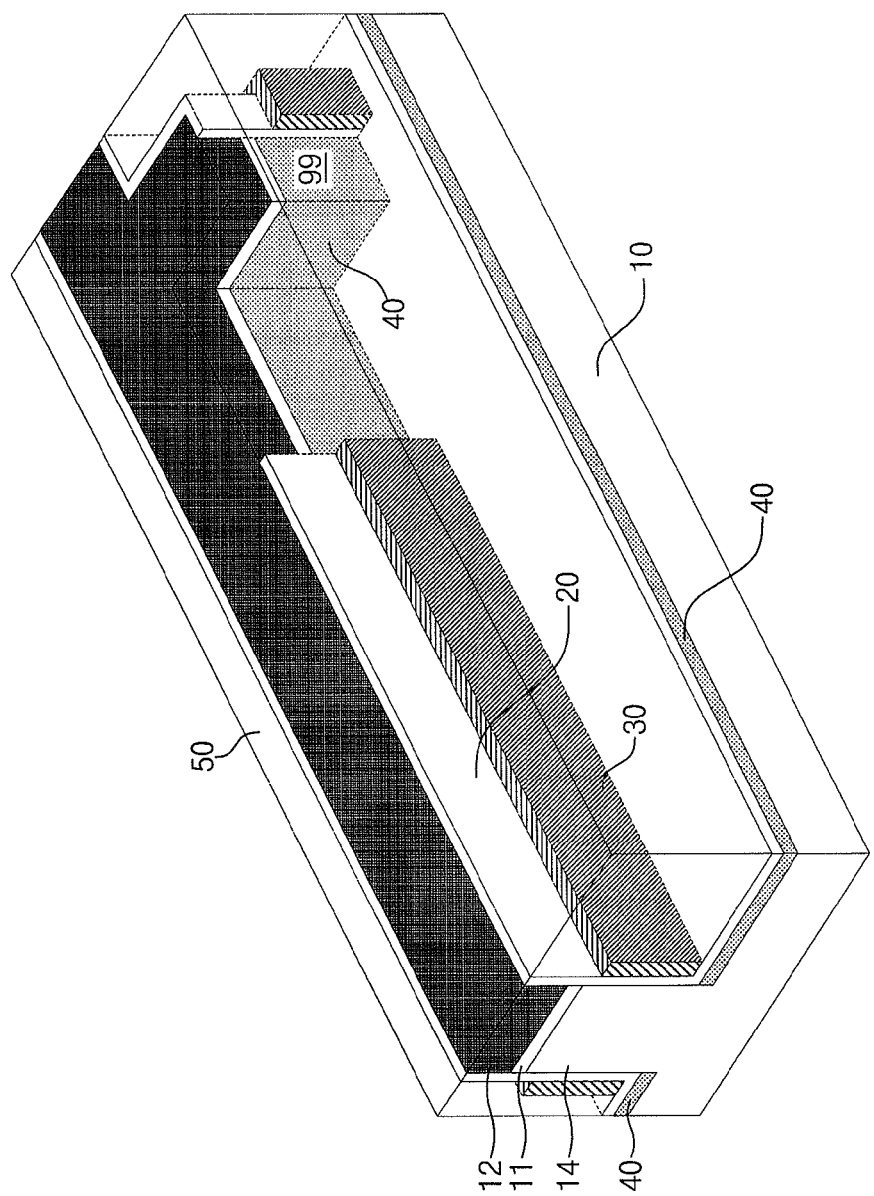
Figure 12:
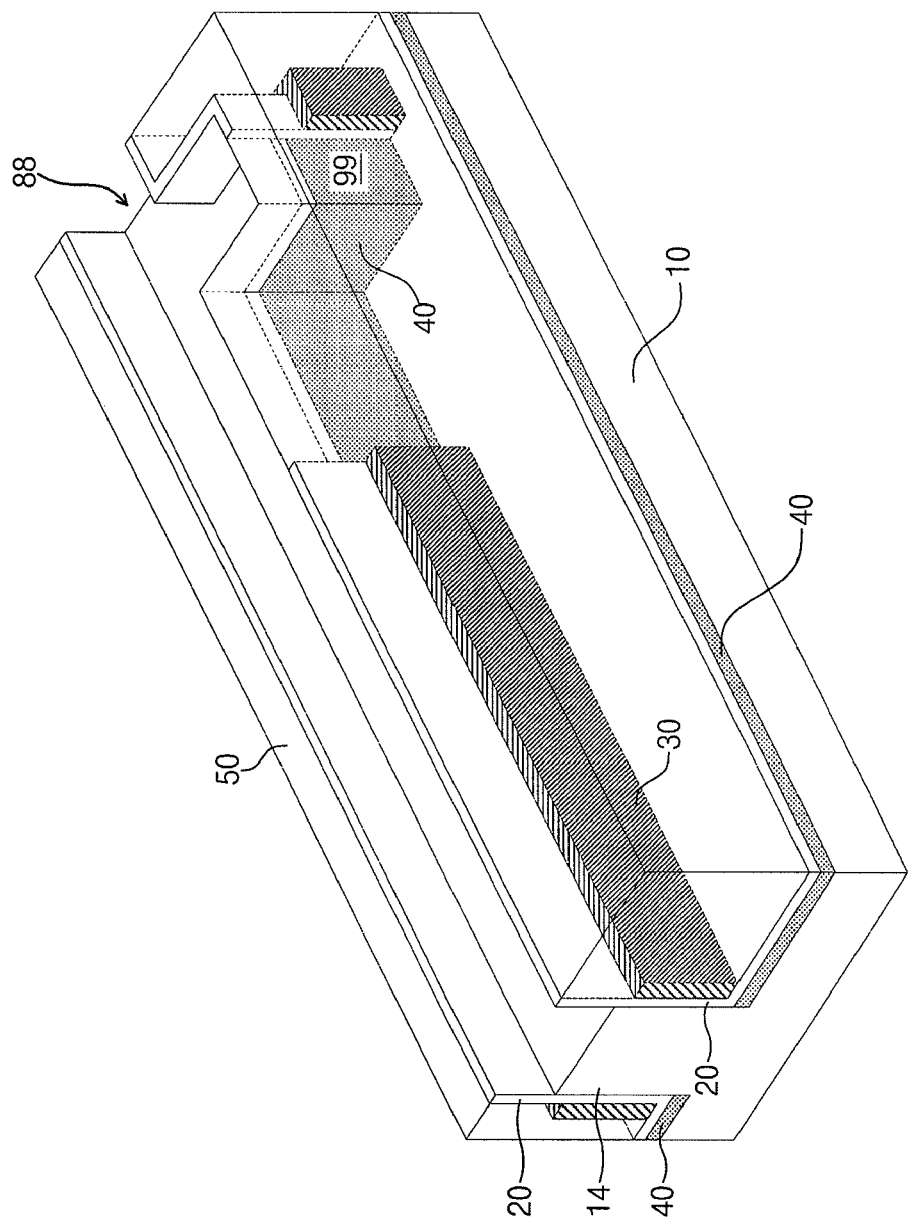
Figure 13:
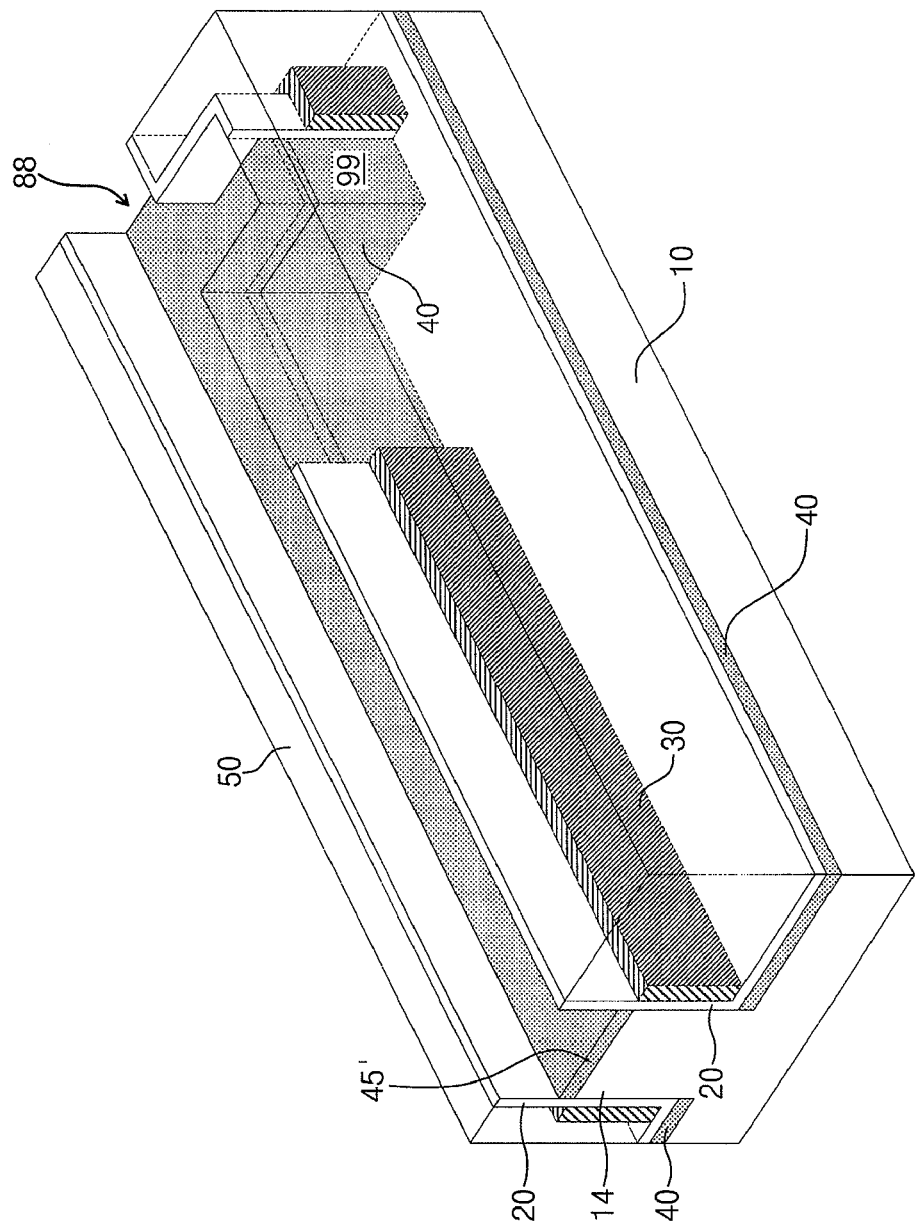

Referring to FIGS. 11 through 13, after forming the lower interlayer insulating layer 50 on the resultant structure including the lower interconnections 40, the lower interlayer insulating layer 50 may be patterned and etched to expose a top surface of the mask layer 12. According to exemplary embodiments, the lower interlayer insulating layer 50 may include a silicon oxide layer. After that, the exposed mask layer 12 and the underlying pad insulating layer 11 may be removed. As a result, a top surface of the active line 14 may be exposed in an indentation 88, as illustrated in FIG. 12.

An ion implantation process may be performed using the lower interlayer insulating layer 50 as an ion mask to form an upper impurity layer 45' on the exposed top surface of the active line 14, as illustrated in FIG. 13, and may partially fill the indentation 88. A conductivity type of the implanted impurity may be the same as the type of the impurity used for the lower interconnections 40.

As described above, in the contact region 99, the lower interconnections 40 may be formed to extend to a sidewall of the active line 14 from a bottom of the trench. Thus, the upper impurity region 45 may be connected to the lower interconnections 40 at the contact region 99. The upper impurity regions 45 and the lower interconnections 40 may have the same conductivity type.

Figure 14:
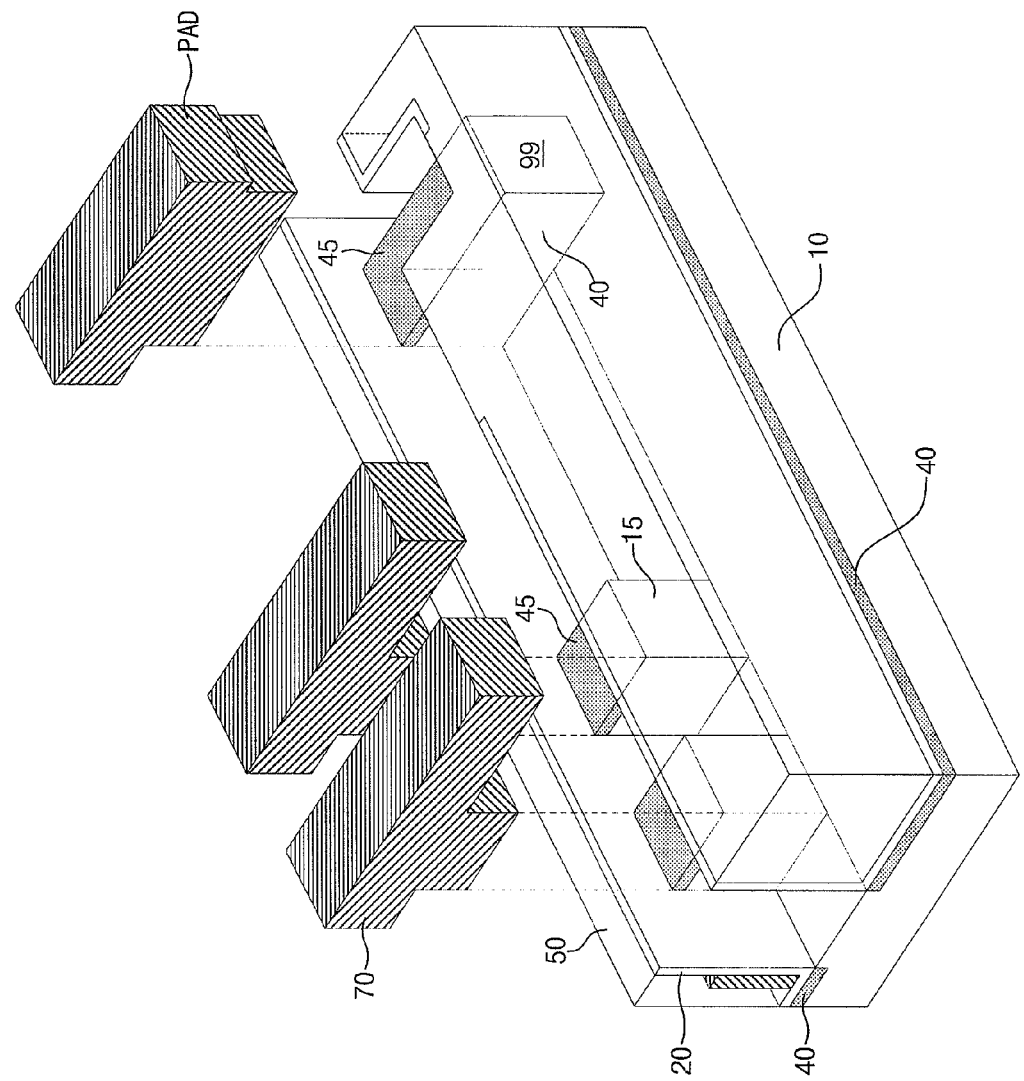

Referring to FIG. 14, upper interconnections 70 crossing, e.g., perpendicular to, the active lines 14 may be formed. Forming the upper interconnection 70 may include forming a conductive layer on the resultant structure including the upper impurity regions 45, forming a mask pattern (not shown) crossing the active lines 14 on the resultant structure, and patterning the conductive layer using the mask pattern as an etching mask. At this time, the conductive layer may be etched until a top surface of the active line 14 may be exposed. According to exemplary embodiments, the conductive layer may include at least one of barrier metal layers for an ohmic contact with the upper impurity region 45 and metal materials of a low resistivity.

The active line 14 having an exposed top surface may be further patterned to form active pillars 15 under the upper impurity regions 45. In this step, the mask pattern may be used as an etching mask for patterning the active pillars 15. The active pillars 15 may be used as a channel region of a memory cell transistor according to the present embodiment as described in references to FIGS. 1 through 7. In addition, the upper impurity regions 45 may also be patterned, so that the patterned upper impurity regions 45 may be locally formed under the upper interconnection 70.

In the meantime, the conductive layer in the contact region 99 may be etched during the patterning to form a pad (PAD) that may be electrically connected to the lower interconnections 40. The upper interconnection 70 may not be connected to the lower interconnections 40. However, since the upper impurity region 45 on the contact region 99 may be electrically connected to the lower interconnections 40, which is used as the lower interconnection through a sidewall of the active line 14, the pad (PAD) may be electrically connected to the lower interconnections 40.

After that, an interconnection structure connecting the upper interconnection 70 and the pad (PAD) to the upper line decoder and to the lower line decoder may be further formed.

Figure 5:
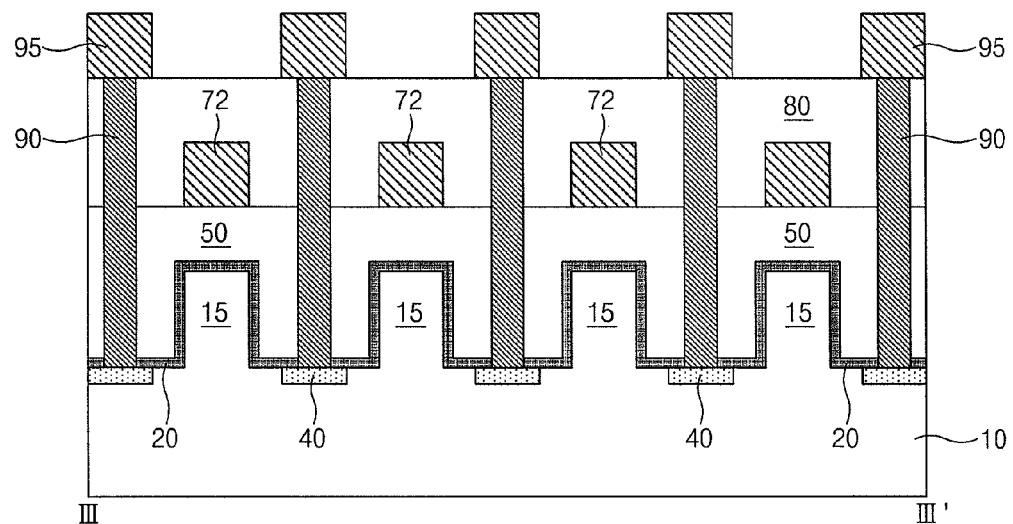
Figure 6:
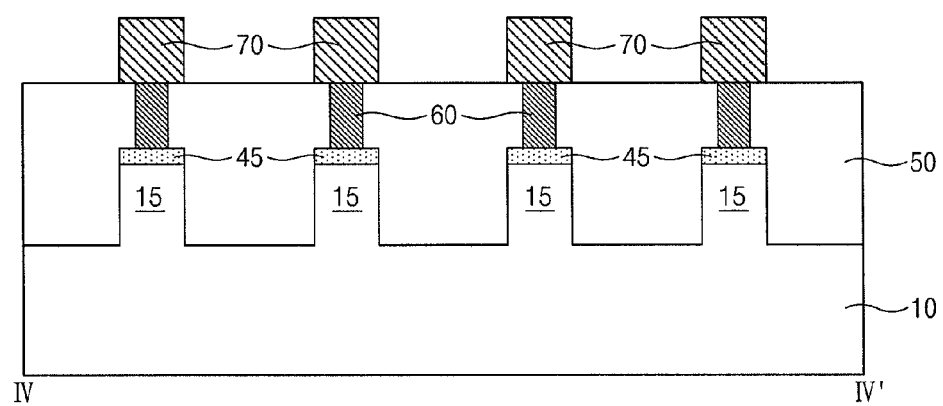
Figure 7:
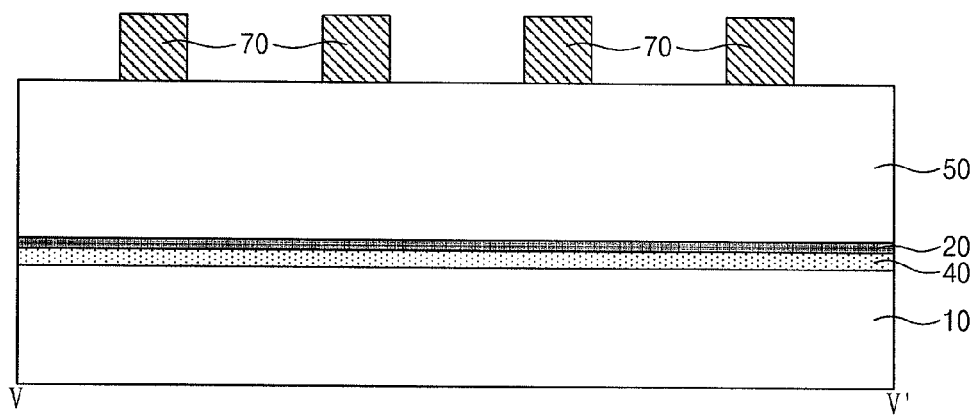

According to a modified embodiment, an electrical connection between the lower interconnections 40 and the lower line decoder may be accomplished through the lower interconnection plugs 90 vertically passing by between the active pillars 15 and the first metal interconnections 72 and connected to the second interconnections 95 as illustrated in FIGS. 1 and 5. At this time, before forming the lower interconnection plugs 90, forming an insulating spacer on sidewalls of the first metal interconnections 72 may be further included.

According to exemplary embodiments, each of the data storage patterns 20 may have a plurality of data storage regions. Data stored in each of the data storage regions may be independently changed or may be read by controlling a voltage applied to the upper interconnections 70, the lower interconnections 40, and the word lines 30. Specifically, referring to FIGS. 15 through 17, a method of operating a semiconductor device according to exemplary embodiments will be described.

Figure 15:
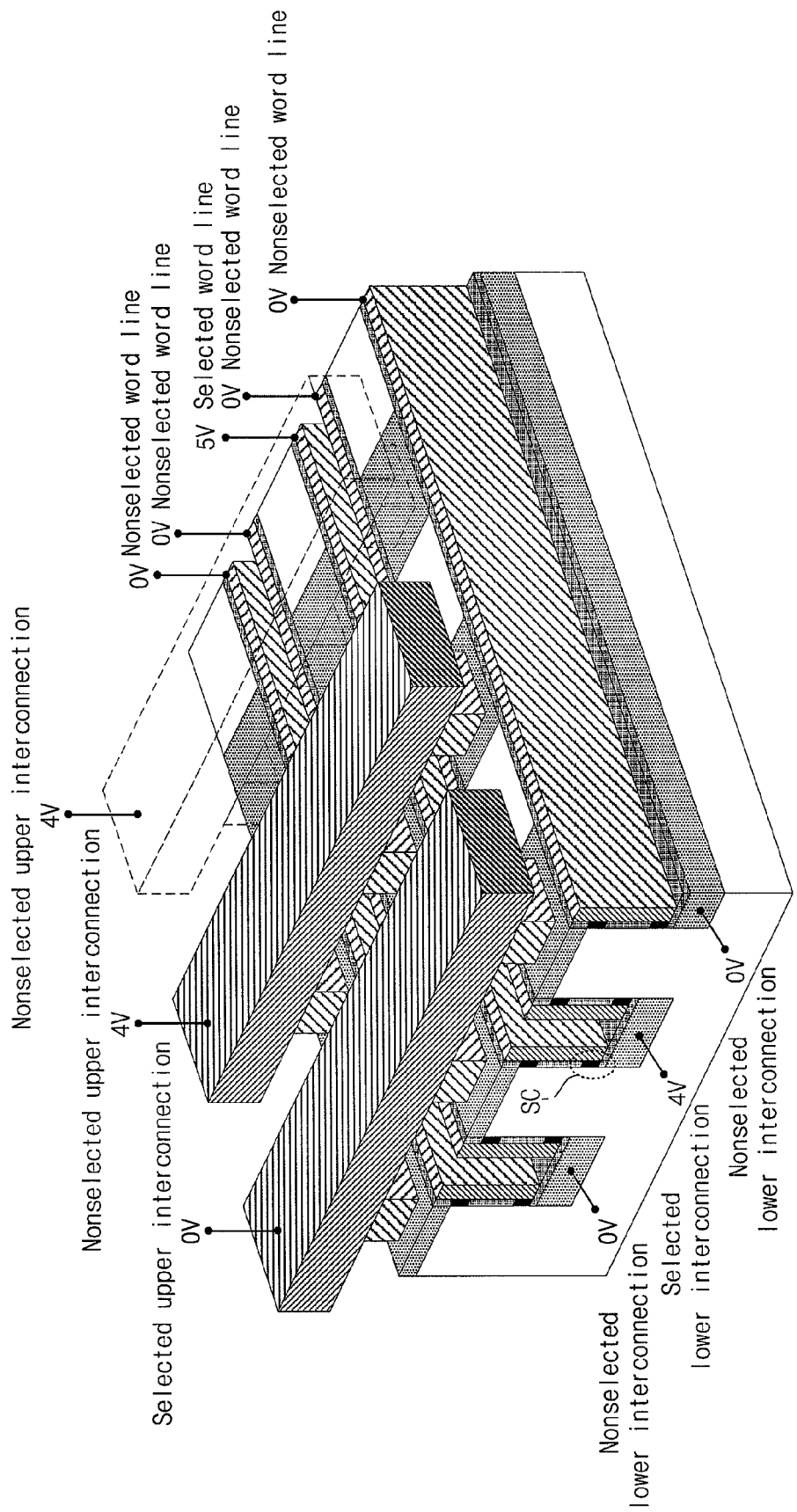
FIGS. 15 through 17 illustrate views of a method of operating a semiconductor device according to exemplary embodiments.

Referring to FIG. 15, an operation of a program may include an operation of injecting charges to different regions of the data storage pattern 20 using a hot carrier injection. A program gate voltage, a program source voltage, and a program drain voltage may be applied to a selected word line, a selected upper interconnection, and a selected lower interconnection, which are adjacent to the selected data storage region (SC), respectively.

According to exemplary embodiments, the program gate voltage may be a magnitude, e.g., 5 V, that makes the active pillar an inversion layer. In this case, the selected upper interconnection and the selected lower interconnection may be electrically connected to each other by the inversion layer. The program source voltage and the program drain voltage may have different magnitudes so as to make a current flow between the lower interconnections and the upper interconnections but may be selected so that the inversion layer becomes pinched off around the selected data storage region (SC). The program source voltage may be 0 V and the program drain voltage may be 4 V. When the inversion layer is pinched off around the selected data storage region (SC), a portion of charges passed by the inversion layer may have a high energy by a strong electric field generated from the pinched off region. As a result, the portion of charges may be injected into a data storage region adjacent to the selected active pillar.

A voltage lower than a threshold voltage of the active pillar may be applied to nonselected word lines to prevent unintended charges from being injected into a nonselected data storage region. In this case, since a channel is not formed on the active pillars adjacent to the nonselected word lines, an unintended program to a data storage region adjacent to the nonselected active pillar may be prevented.

In addition, a voltage equal to the voltage applied to the selected lower interconnection may be applied to nonselected upper interconnections. In this case, a channel may be formed on an active pillar adjacent to the selected word line. Since there is not an electric potential between the nonselected upper interconnections and the selected lower interconnection, a current contributed to the program may not be made.

Figure 16:
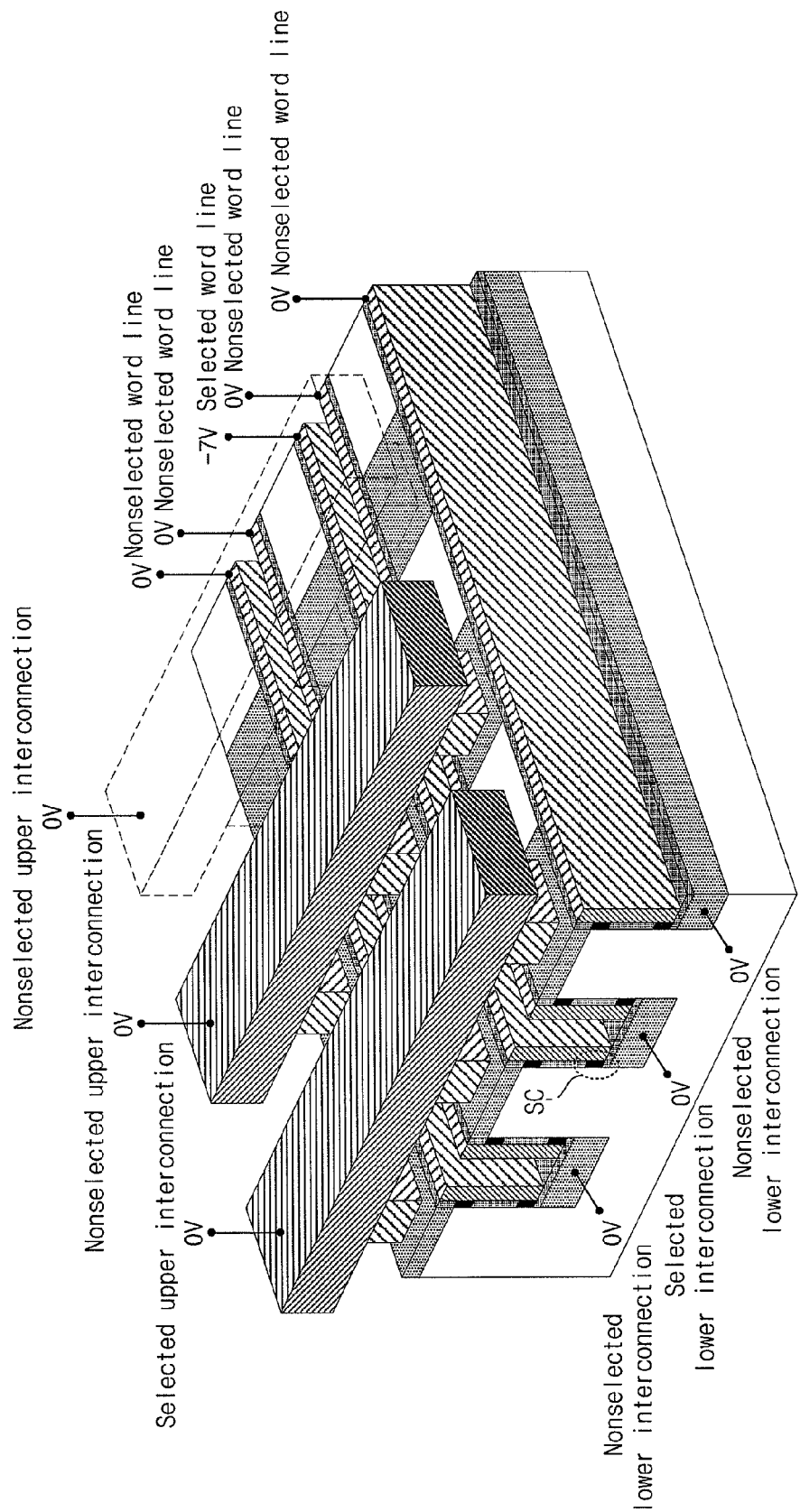

Referring to FIG. 16, an operation of erasing may include an operation of discharging charges stored in the data storage regions adjacent to the selected word line by applying an erasing voltage to the selected word line. For example, charges stored in the data storage pattern may be discharged to the active pillars by applying −7 V to the selected word line and applying a ground voltage to the upper interconnections and the lower interconnections.

A ground voltage may be applied to the active pillars. According to modified embodiment, a ground voltage may be applied to the selected word line while a minus voltage may be applied to the active pillars or to the upper and lower interconnections to discharge charges from the data storage pattern.

Figure 17:
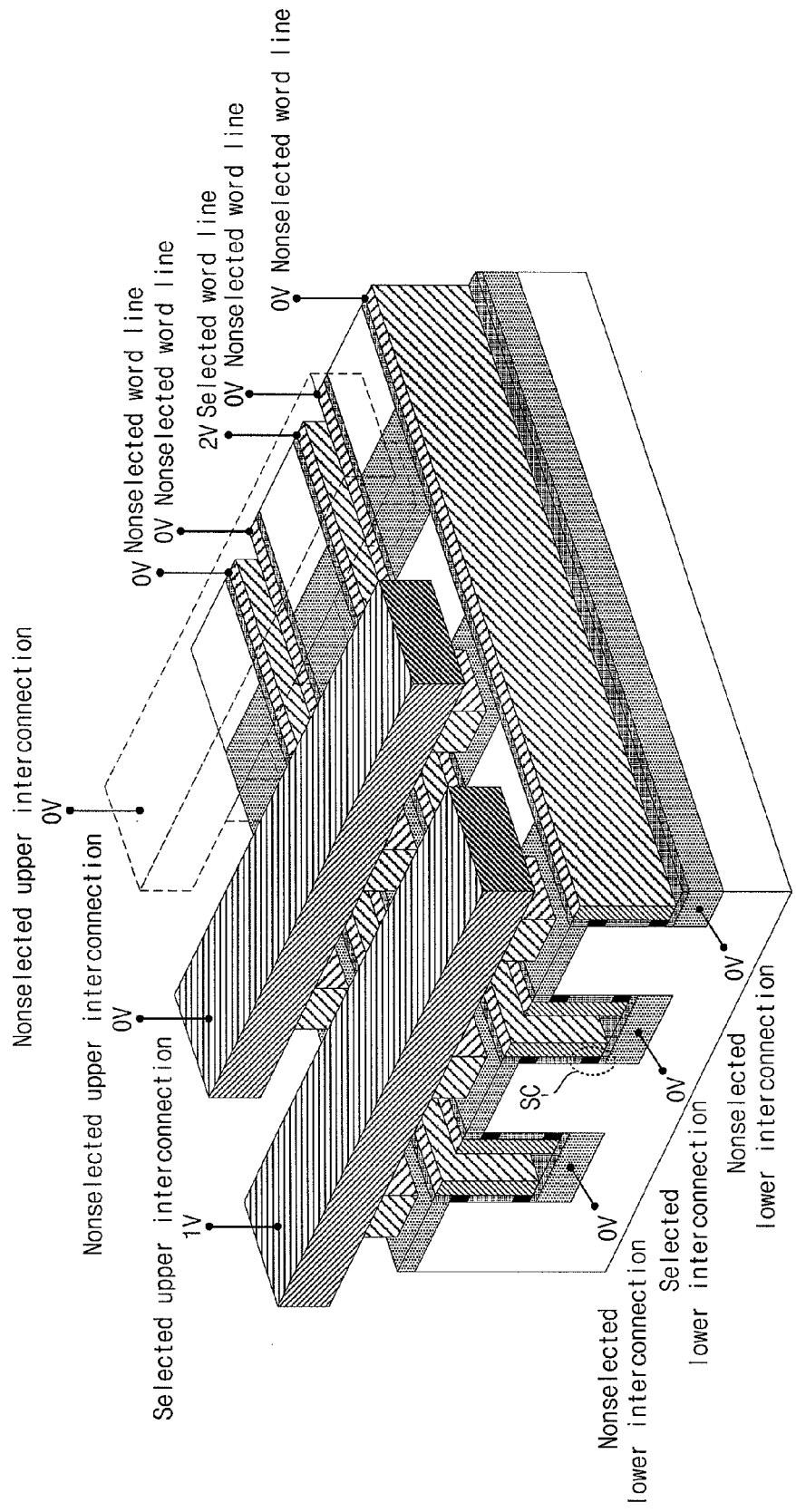

Referring to FIG. 17, a read gate voltage, a read upper voltage, and a read lower voltage may be applied to a selected word line, a selected upper interconnection, and a selected lower interconnection, respectively, during a reading step. Magnitudes of the read gate voltage, the read upper voltage, and the read lower voltage may be 2 V, 1 V and 0 V, respectively but the magnitudes are not limited to those voltages. The reading step may use one of various reading methods of a NOR flash memory suggested for a multi level cell.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of operating a semiconductor device including:
    active pillars extending from a semiconductor substrate and disposed two dimensionally on the semiconductor substrate;
    upper interconnections connecting the active pillars along one direction;
    lower interconnections crossing the upper interconnections and disposed between the active pillars;
    word lines crossing the upper interconnections and disposed between the active pillars; and
    data storage patterns disposed between the word lines and the active pillars, each data storage pattern being disposed between one upper interconnection and one lower interconnection including at least a first data storage region and a second data storage region that are adjacent, but separated from each other, the method including:
    programming the data storage region by selectively injecting charges into one of the first and second data storage regions.

2. The method as claimed in claim 1, wherein programming includes selectively pinching off a channel formed on a sidewall of the active pillar around one of regions adjacent to the upper and lower interconnections.

3. The method as claimed in claim 1, wherein programming includes:
    injecting charges into the first data storage region using the upper interconnection and the lower interconnection as a source electrode and a drain electrode, respectively; and
    injecting charges into the second data storage region using the upper interconnection and the lower interconnection as a drain electrode and a source electrode, respectively.

4. The method as claimed in claim 1, wherein programming includes applying a voltage lower than a threshold voltage to nonselected word lines to prevent channels from being formed inside the active pillars adjacent to the nonselected word lines.

5. The method as claimed in claim 1, wherein programming includes applying a voltage applied to a selected lower interconnection to nonselected upper interconnections to prevent a difference of an electric potential from being generated between the nonselected upper interconnection and the selected lower interconnection.

6. The method as claimed in claim 1, further comprising:
    erasing discharging charges from the data storage patterns, wherein erasing includes discharging charges to the active pillar from the data storage pattern using a difference of an electric potential between the word line and the active pillar adjacent to the word line.

7. A method of manufacturing a semiconductor device, the method comprising:
    patterning a pad insulating layer and a mask layer on a substrate to form trenches defining active lines;
    forming a data storage pattern on active lines;
    forming a conductive layer spacers on the data storage pattern and patterning the conductive layer spacers to expose a side wall of the active lines; wherein the conductive layer spacers are physically separated and disposed on both sidewalls of the active lines;
    forming lower interconnections on a bottom of the trenches;
    forming an interlayer insulating layer on the lower interconnections;
    forming an upper impurity region on an exposed top surface of the active lines using the interlayer insulating layer as an ion mask;
    forming upper interconnections crossing the active lines;
    patterning the active line to form active pillars that is used as a channel region of a memory cell transistor;
    forming a pad electrically connected to the lower interconnections; and
    forming an interconnection structure connecting the upper interconnection and the pad to an upper line decoder and to a lower line decoder.

8. The method as claimed in claim 7, wherein forming the upper interconnections further includes:
    forming a conductive layer on the upper impurity regions;
    forming a mask pattern crossing the active lines; and
    patterning the conductive layer using the mask pattern as an etching mask, wherein the conductive layer is etched until a top surface of the active line is exposed.

9. The method as claimed in claim 7, further comprising:
    patterning the upper impurity regions so that the upper impurity regions are locally formed under the upper interconnection.

10. The method as claimed in claim 7, wherein forming lower interconnection plugs to be connected to second interconnections to provide an electrical connection between the lower interconnections and the lower line decoder.

11. The method as claimed in claim 10, wherein further forming an insulating spacer on sidewalls of first metal interconnections before forming the lower interconnection plugs.

12. The method as claimed in claim 7, further comprising forming at least two word lines between adjacent active pillars.

* * * * *